US008952253B2

(12) United States Patent
Huang et al.

(10) Patent No.: US 8,952,253 B2
(45) Date of Patent: Feb. 10, 2015

(54) ENCLOSURE OF ELECTRONIC DEVICE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Wei Huang, Shenzhen (CN); Lei Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 247 days.

(21) Appl. No.: 13/686,934

(22) Filed: Nov. 28, 2012

(65) Prior Publication Data

US 2014/0140014 A1 May 22, 2014

(30) Foreign Application Priority Data

Nov. 22, 2012 (CN) .......................... 2012 1 0477125

(51) Int. Cl.
*H05K 5/02* (2006.01)
*H01R 13/6596* (2011.01)
*H01R 13/6583* (2011.01)

(52) U.S. Cl.
CPC ........ *H01R 13/6596* (2013.01); *H01R 13/6583* (2013.01); *Y10S 439/939* (2013.01)
USPC .......... 174/51; 174/50.52; 361/747; 361/753; 361/799; 361/818; 439/168; 439/357; 439/607.28; 439/939; 439/101

(58) Field of Classification Search
CPC ........................ H01R 13/6271; H01R 13/6596
USPC .......... 361/818, 753, 799, 806; 439/939, 101, 439/357, 108, 607.28; 220/324, 326; 174/50, 50.52, 51, 52, 520, 535, 545, 174/59
See application file for complete search history.

(56) References Cited

U.S. PATENT DOCUMENTS

| | | | | | |
|---|---|---|---|---|---|
| 5,709,569 | A * | 1/1998 | Buck et al. | ............... | 439/607.01 |
| 5,772,471 | A * | 6/1998 | Buck | ........................ | 439/607.28 |
| 5,838,550 | A * | 11/1998 | Morris et al. | ................. | 361/818 |
| 6,132,253 | A * | 10/2000 | Wu | .......................... | 439/607.19 |
| 6,508,667 | B1 * | 1/2003 | Nien | ............................ | 439/553 |
| 6,608,766 | B2 * | 8/2003 | Wortman et al. | ............. | 361/818 |
| 6,822,872 | B2 * | 11/2004 | Schulz et al. | ................. | 361/747 |
| 6,822,879 | B2 * | 11/2004 | Rathnam et al. | .............. | 361/818 |
| 6,940,731 | B2 * | 9/2005 | Davis et al. | ................... | 361/801 |
| 7,210,946 | B2 * | 5/2007 | Chen | ............................... | 439/92 |
| 7,568,950 | B2 * | 8/2009 | Belopolsky et al. | ..... | 439/607.55 |
| 7,692,932 | B2 * | 4/2010 | Bisbikis et al. | ............... | 361/799 |
| 7,729,130 | B1 * | 6/2010 | Bianchini | ..................... | 361/816 |
| 7,731,512 | B1 * | 6/2010 | Montena et al. | .............. | 439/108 |
| 8,724,343 | B2 * | 5/2014 | Feldstein et al. | .............. | 361/818 |
| 8,790,136 | B2 * | 7/2014 | Duesterhoeft | ........... | 439/607.35 |
| 2005/0225958 | A1 * | 10/2005 | Lewis | ........................... | 361/818 |
| 2008/0130216 | A1 * | 6/2008 | Tsai et al. | ..................... | 361/685 |
| 2009/0244856 | A1 * | 10/2009 | Pirillis | .......................... | 361/747 |

* cited by examiner

*Primary Examiner* — Lisa Lea Edmonds
*Assistant Examiner* — Keith Depew
(74) *Attorney, Agent, or Firm* — Novak Druce Connolly Bove & Quigg LLP

(57) ABSTRACT

An enclosure includes a sidewall defining an opening through which a connector is to extend and a through hole, a resilient piece, and a sliding member slidably received in the through hole. The resilient piece includes a connecting piece slantingly extending from the sidewall between the opening and the through hole and a contacting piece connected to a distal end of the connecting piece. When the connector extends through the opening, The sliding member is slid toward the resilient piece to force the contacting piece to contact the connector.

6 Claims, 2 Drawing Sheets

ENCLOSURE OF ELECTRONIC DEVICE

BACKGROUND

1. Technical Field

The present disclosure relates to an enclosure of an electronic device.

2. Description of Related Art

A resilient metal piece is often mounted to an inner surface of a sidewall of an enclosure to contact a top of a connector extending through the sidewall; therefore, electromagnetic waves can be transmitted to ground through the resilient piece and the sidewall. However, the electromagnetic waves will escape out of the enclosure through a gap between the connector and the resilient piece in case the resilient piece cannot contact the connector tightly, which is undesirable.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
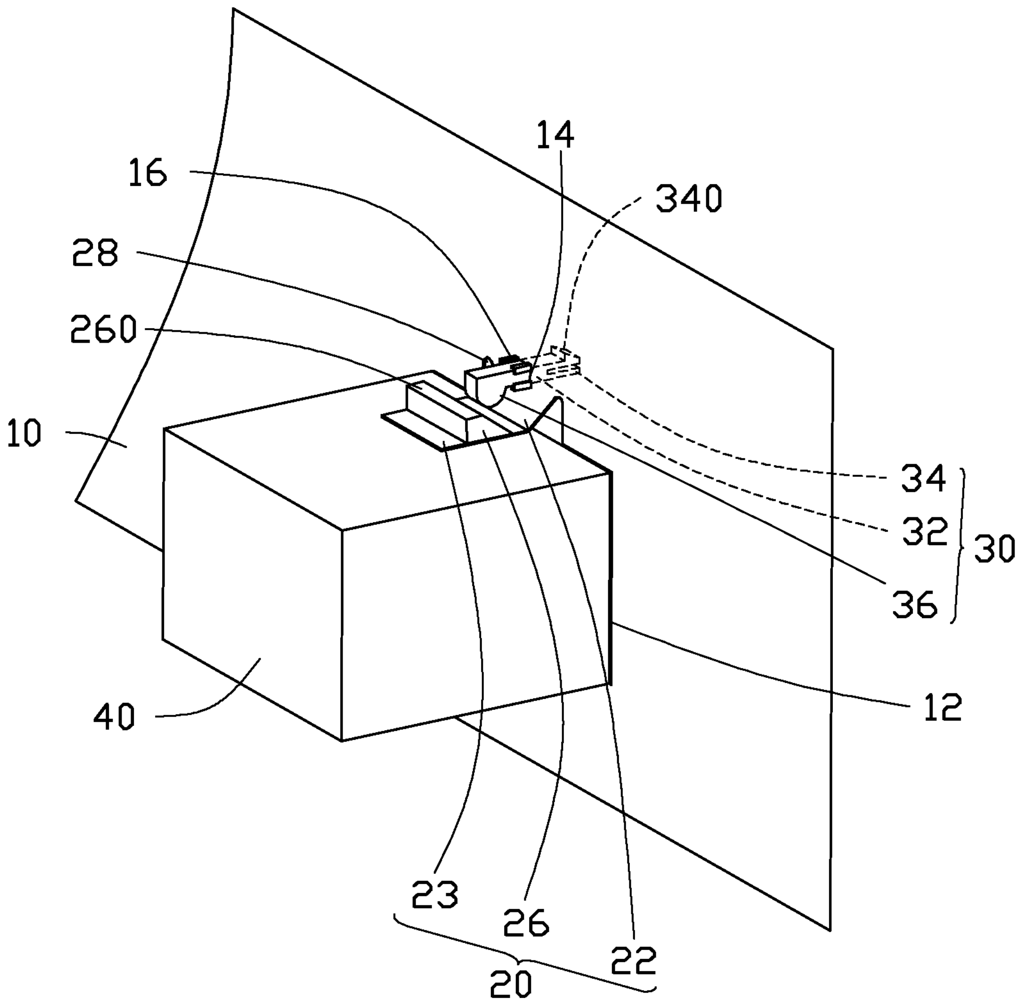
FIG. 1 is an assembled, isometric view of an exemplary embodiment of an enclosure, together with a connector.

FIG. 1 shows an exemplary embodiment of an enclosure of an electronic device, such as a computer. The electronic device includes a metal sidewall 10, a resilient metal piece 20, and a sliding member 30.

The sidewall 10 defines an opening 12 through which a connector 40 is to extend, and a through hole 14 above the opening 12. A hollow holding portion 16 is mounted on an inner surface of the sidewall 10 around the through hole 14. In this embodiment, the through hole 14 is rectangular, and the holding portion 16 includes four L-shaped rails facing the through hole 14 and respectively at four corners of the through holes 14. In another embodiment, the through hole 14 can be other shapes, such as triangular or round, and the holding portion 16 can be a hollow triangular prism or a cylinder corresponding to the shape of the through hole 14.

The metal piece 20 includes a resilient connecting piece 22 slantingly extending inward and down from the inner surface of the sidewall 10 between the opening 12 and the through hole 14, and a contacting piece 23 extending from a distal end of the connecting piece 22 opposite to the sidewall 10. The contacting piece 23 includes a block 26 on a top surface. The block 26 is made of rubber, and includes a top surface 260 opposite to the contacting piece 23 and a slanted surface 262 (labeled in FIG. 2) slantingly extending downward and toward the connecting piece 22 from the top surface 260. A slot 28 communicating with the opening 12 is defined in the sidewall 10 and is aligned with the connecting piece 22. In another embodiment, the slot 28 can be omitted.

The sliding member 30 includes a main portion 32, two spaced latches 34 extending from a first end of the main portion 32, and a protrusion 36 extending down from a second end of the main portion 32 opposite to the first end. A wedge-shaped projection 340 protrudes from a distal end of a side of one of the latches 34 opposite to the other latch 34. A bottom surface of the protrusion 36 is arc-shaped. The latches 34 are deformed toward each other to extend through the holding portion 16 and the through hole 14, and then are restored to allow the projection 340 to abut an outer surface of the sidewall 10 opposite to the holding portion 16. Therefore, the main portion 32 is slidably received in the holding portion 16.

Figure 2:
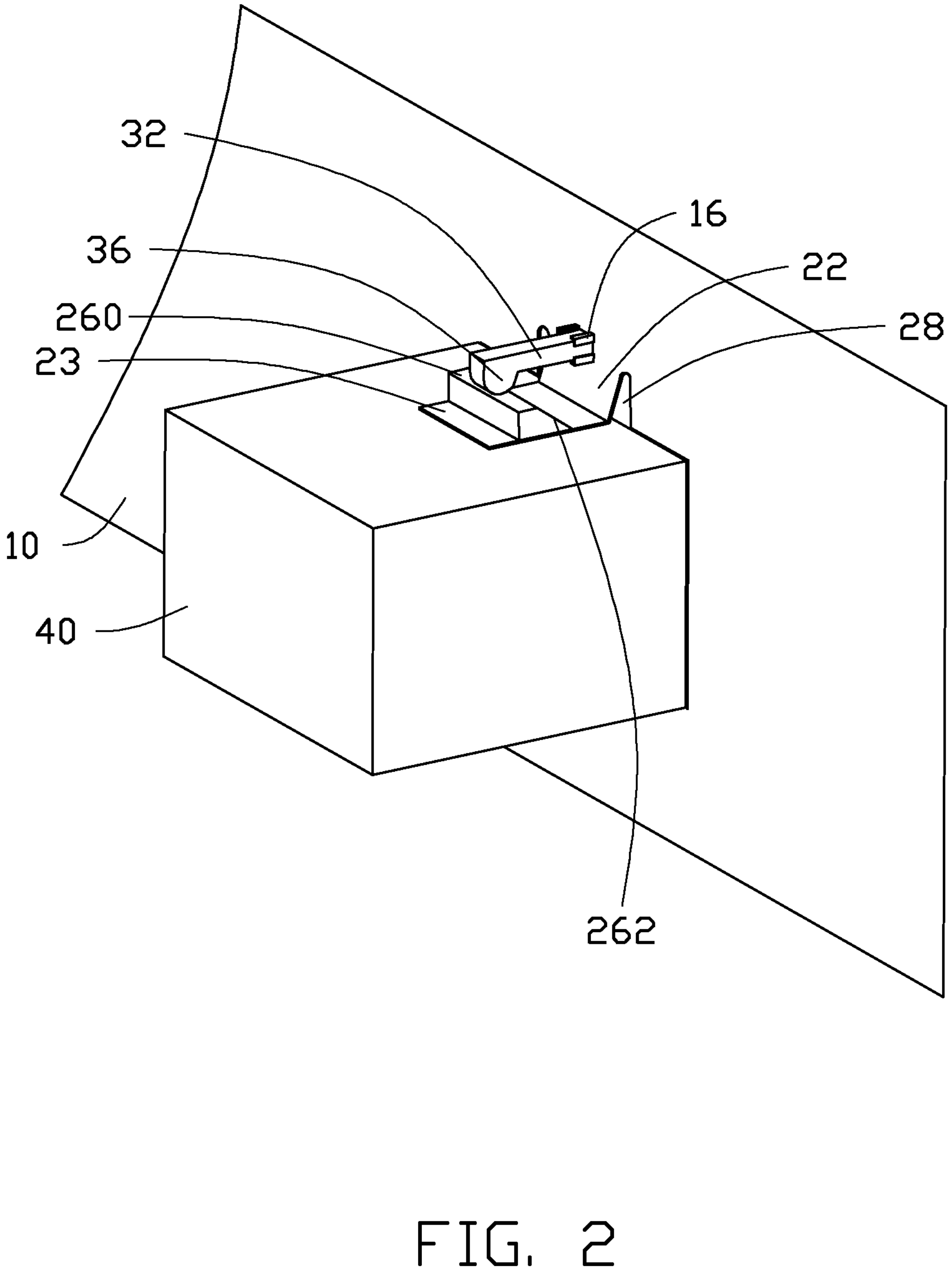
FIG. 2 is similar to FIG. 1, but showing another using state.

FIG. 2 shows that in use, the sliding member 30 is slid outward. The connector 40 is extended through the opening 12. The sliding member 30 is then slid inward, the protrusion 36 slides along the slanted surface 262 to deform the resilient piece 20 toward the connector 40, until the bottom of the protrusion 36 abuts the top surface 260. At this time, the contacting piece 23 contacts a top of the connector 40, the projection 340 abuts the outer surface of the sidewall 10.

Because the sliding member 30 can maintain the contacting piece 23 tightly contacting the connector 40, electromagnetic waves can be transmitted to ground through the resilient piece 20 and the sidewall 10 all the time.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. An enclosure, comprising:

a metal sidewall defining an opening through which a connector is to extend, and a through hole;

a resilient metal piece comprising a connecting piece slantingly extending down from a first side of the sidewall between the opening and the through hole, and a contacting piece extending from a distal end of the connecting piece; and a sliding member slidably received in the through hole;

wherein, when the connector extends through the opening, the sliding member is operable to be slid toward the resilient piece to deform the resilient piece toward the connector, thus maintaining the contacting piece contacting the connector.

2. The enclosure of claim 1, wherein the resilient piece further comprises a block on a surface of the contacting piece opposite to the connector, the block comprises a top wall opposite to the contacting piece and a slanted surface facing the connecting piece, the sliding member comprises a protrusion slidable along the slanted surface to deform the resilient piece and abutted the top surface to maintain the contacting piece contacting the connector.

3. The enclosure of claim 2, wherein a surface of the protrusion facing the metal piece is arc-shaped.

4. The enclosure of claim 2, wherein the sliding member further comprises two spaced latches at an end of the sliding member away from the protrusion, a projection protrudes from one of the latches away from the other latch, the latches extend through the through hole, and the projection abuts a second side of the sidewall opposite to the first side to retain the sliding member to the sidewall.

5. The enclosure of claim 1, wherein a hollow holding portion protrudes from the sidewall around the through hole to slidably receive the sliding member.

6. The enclosure of claim 5, wherein the through hole is rectangular, the holding portion comprises four L-shaped rails facing the through holes and located at four corners of the through hole.

* * * * *